United States Patent
Osamura et al.

(10) Patent No.: US 8,299,968 B2
(45) Date of Patent: *Oct. 30, 2012

(54) PACKAGING MATERIAL WITH ELECTROMAGNETIC COUPLING MODULE

(75) Inventors: Makoto Osamura, Mukou (JP); Norio Sakai, Moriyama (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 569 days.

This patent is subject to a terminal disclaimer.

(21) Appl. No.: 12/536,663

(22) Filed: Aug. 6, 2009

(65) Prior Publication Data

US 2009/0302972 A1    Dec. 10, 2009

Related U.S. Application Data

(63) Continuation of application No. PCT/JP2008/050358, filed on Jan. 15, 2008.

(30) Foreign Application Priority Data

Feb. 6, 2007  (JP) ................. 2007-026461

(51) Int. Cl.
*H01Q 1/38* (2006.01)
*H04B 7/00* (2006.01)

(52) U.S. Cl. ............ 343/700 R; 343/702; 340/572.1; 455/39

(58) Field of Classification Search .......... 235/487–492, 235/439; 361/760; 340/572.1, 572.7; 343/700 R, 343/702; 455/39

See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |

(Continued)

FOREIGN PATENT DOCUMENTS

DE    10 2006 057 369 A1    6/2008

(Continued)

OTHER PUBLICATIONS

English translation of NL9100176, published on Mar. 2, 1992.

(Continued)

*Primary Examiner* — Angel R Estrada
*Assistant Examiner* — Dimary Lopez
(74) *Attorney, Agent, or Firm* — Keating & Bennett, LLP

(57) ABSTRACT

A packaging material includes an electromagnetic coupling module for an RFID system, in which a radio IC chip is protected from external shock and environmental change without affecting the planarity of the packaging material, the assembly including an electromagnetic coupling module is facilitated, and the radiation characteristics are satisfactory. A packaging material includes a liner and a wave-shaped core material, wherein an electromagnetic coupling module is arranged inside of the packaging material. The electromagnetic coupling module includes a radio IC chip and a feeder circuit board, on which the radio IC chip is mounted, the feeder circuit board including a resonant circuit that includes an inductance element. The packaging material is made of a dielectric, wherein the dielectric and the electromagnetic coupling module are electromagnetically coupled to transmit/receive high frequency signals.

7 Claims, 3 Drawing Sheets

U.S. PATENT DOCUMENTS

| | | | |
|---|---|---|---|
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,611 A | 8/2000 | Glover et al. | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,435,415 B1 * | 8/2002 | Catte | 235/492 |
| 6,448,874 B1 | 9/2002 | Shiino et al. | |
| 6,456,172 B1 * | 9/2002 | Ishizaki et al. | 333/133 |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,667,092 B1 * | 12/2003 | Brollier et al. | 428/182 |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,853,345 B2 * | 2/2005 | King et al. | 343/795 |
| 6,927,738 B2 | 8/2005 | Senba et al. | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,132,984 B2 * | 11/2006 | Kameda et al. | 343/700 MS |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 7,460,078 B2 * | 12/2008 | King et al. | 343/767 |
| 7,872,579 B2 * | 1/2011 | Rancien et al. | 340/572.1 |
| 8,079,519 B2 * | 12/2011 | Pepori et al. | 235/439 |
| 2002/0011967 A1 | 1/2002 | Goff et al. | |
| 2002/0044092 A1 | 4/2002 | Kushihi | |
| 2002/0067316 A1 | 6/2002 | Yokoshima et al. | |
| 2003/0006901 A1 | 1/2003 | Kim et al. | |
| 2003/0020661 A1 | 1/2003 | Sato | |
| 2003/0147197 A1 * | 8/2003 | Uriu et al. | 361/311 |
| 2003/0169153 A1 | 9/2003 | Muller | |
| 2004/0001027 A1 | 1/2004 | Killen et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0138798 A1 | 6/2005 | Sakama et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0220871 A1 | 10/2006 | Baba et al. | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2008/0024156 A1 | 1/2008 | Arai et al. | |
| 2008/0087990 A1 | 4/2008 | Kato et al. | |
| 2008/0169905 A1 | 7/2008 | Slatter | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0065594 A1 | 3/2009 | Kato et al. | |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 280 232 A1 | 1/2003 |
| EP | 1 357 511 A2 | 10/2003 |
| JP | 50-143451 A | 11/1975 |
| JP | 62-127140 U | 8/1987 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-069533 A | 3/1998 |
| JP | 10-505466 A | 5/1998 |
| JP | 10-171954 A | 6/1998 |
| JP | 10-193849 A | 7/1998 |
| JP | 10-293828 A | 11/1998 |
| JP | 11-039441 A | 2/1999 |
| JP | 11-075329 A | 3/1999 |
| JP | 11-085937 A | 3/1999 |
| JP | 11-102424 A | 4/1999 |
| JP | 11-103209 A | 4/1999 |
| JP | 11-149536 A | 6/1999 |
| JP | 11-149538 A | 6/1999 |
| JP | 11-219420 A | 8/1999 |
| JP | 11-220319 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |

| | | | | | | |
|---|---|---|---|---|---|---|
| JP | 2000-148948 A | 5/2000 | | JP | 2003-158414 A | 5/2003 |
| JP | 2000-172812 A | 6/2000 | | JP | 2003-187207 A | 7/2003 |
| JP | 2000-222540 A | 8/2000 | | JP | 2003-187211 A | 7/2003 |
| JP | 2000-510271 A | 8/2000 | | JP | 2003-188338 A | 7/2003 |
| JP | 2000-243797 A | 9/2000 | | JP | 2003-198230 A | 7/2003 |
| JP | 2000-251049 A | 9/2000 | | JP | 2003-209421 A | 7/2003 |
| JP | 2000-276569 A | 10/2000 | | JP | 2003-216919 A | 7/2003 |
| JP | 2000-286634 A | 10/2000 | | JP | 2003-218624 A | 7/2003 |
| JP | 2000-286760 A | 10/2000 | | JP | 2003-233780 A | 8/2003 |
| JP | 2000-311226 A | 11/2000 | | JP | 2003-242471 A | 8/2003 |
| JP | 2000-321984 A | 11/2000 | | JP | 2003-243918 A | 8/2003 |
| JP | 3075400 U | 11/2000 | | JP | 2003-249813 A | 9/2003 |
| JP | 2000-349680 A | 12/2000 | | JP | 2003-529163 A | 9/2003 |
| JP | 2001-028036 A | 1/2001 | | JP | 2003-288560 A | 10/2003 |
| JP | 2007-18067 A | 1/2001 | | JP | 2003-309418 A | 10/2003 |
| JP | 2001-043340 A | 2/2001 | | JP | 2003-331246 A | 11/2003 |
| JP | 2001-66990 A | 3/2001 | | JP | 2003-332820 A | 11/2003 |
| JP | 2001-505682 A | 4/2001 | | JP | 2004-040597 A | 2/2004 |
| JP | 2001-168628 A | 6/2001 | | JP | 2004-082775 A | 3/2004 |
| JP | 2001-188890 A | 7/2001 | | JP | 2004-88218 A | 3/2004 |
| JP | 2001-240046 A | 9/2001 | | JP | 2004-096566 A | 3/2004 |
| JP | 2001-256457 A | 9/2001 | | JP | 2004-253858 A | 9/2004 |
| JP | 2001-514777 A | 9/2001 | | JP | 2004-527864 A | 9/2004 |
| JP | 2001-319380 A | 11/2001 | | JP | 2004-280390 A | 10/2004 |
| JP | 2001-331976 A | 11/2001 | | JP | 2004-287767 A | 10/2004 |
| JP | 2001-332923 A | 11/2001 | | JP | 2004-297249 A | 10/2004 |
| JP | 2001-344574 A | 12/2001 | | JP | 2004-297681 A | 10/2004 |
| JP | 2001-351084 A | 12/2001 | | JP | 2004-319848 A | 11/2004 |
| JP | 2001-352176 A | 12/2001 | | JP | 2004-326380 A | 11/2004 |
| JP | 2002-024776 A | 1/2002 | | JP | 2004-334268 A | 11/2004 |
| JP | 2002-026513 A | 1/2002 | | JP | 2004-336250 A | 11/2004 |
| JP | 2003-030612 A | 1/2002 | | JP | 2004-343000 A | 12/2004 |
| JP | 2002-042076 A | 2/2002 | | JP | 2004-362190 A | 12/2004 |
| JP | 2002-063557 A | 2/2002 | | JP | 2004-362341 A | 12/2004 |
| JP | 2002-505645 A | 2/2002 | | JP | 2004-362602 A | 12/2004 |
| JP | 2002-076750 A | 3/2002 | | JP | 2006-025390 A | 1/2005 |
| JP | 2002-76750 A | 3/2002 | | JP | 2005-124061 A | 5/2005 |
| JP | 2002-150245 A | 5/2002 | | JP | 2005-129019 A | 5/2005 |
| JP | 2002-158529 A | 5/2002 | | JP | 2005-136528 A | 5/2005 |
| JP | 2002-175508 A | 6/2002 | | JP | 3653099 B2 | 5/2005 |
| JP | 2002-183690 A | 6/2002 | | JP | 2005-165839 A | 6/2005 |
| JP | 2002-185358 A | 6/2002 | | JP | 2005-167327 A | 6/2005 |
| JP | 2002-204117 A | 7/2002 | | JP | 2005-167813 A | 6/2005 |
| JP | 2002-522849 A | 7/2002 | | JP | 2005-190417 A | 7/2005 |
| JP | 2003-187207 A | 7/2002 | | JP | 2005-191705 A | 7/2005 |
| JP | 2002-230128 A | 8/2002 | | JP | 2005-210676 A | 8/2005 |
| JP | 2002-252117 A | 9/2002 | | JP | 2005-210680 A | 8/2005 |
| JP | 2002-259934 A | 9/2002 | | JP | 2005-217822 A | 8/2005 |
| JP | 2002-298109 A | 10/2002 | | JP | 2005-236339 A | 9/2005 |
| JP | 2002-308437 A | 10/2002 | | JP | 2005-244778 A | 9/2005 |
| JP | 2002-319008 A | 10/2002 | | JP | 2005-275870 A | 10/2005 |
| JP | 2002-319009 A | 10/2002 | | JP | 2005-284352 A | 10/2005 |
| JP | 2002-319812 A | 10/2002 | | JP | 2005-293537 A | 10/2005 |
| JP | 2003-317060 A | 11/2002 | | JP | 2005-295135 A | 10/2005 |
| JP | 2002-362613 A | 12/2002 | | JP | 2005-311205 A | 11/2005 |
| JP | 2002-373029 A | 12/2002 | | JP | 2005-321305 A | 11/2005 |
| JP | 2002-373323 A | 12/2002 | | JP | 2005-335755 A | 12/2005 |
| JP | 2002-374139 A | 12/2002 | | JP | 2005-346820 A | 12/2005 |
| JP | 2003-006599 A | 1/2003 | | JP | 2005-352858 A | 12/2005 |
| JP | 2003-016412 A | 1/2003 | | JP | 2006-031766 A | 2/2006 |
| JP | 2003-026177 A | 1/2003 | | JP | 2006-39902 A | 2/2006 |
| JP | 2003-030612 A | 1/2003 | | JP | 2006-67479 A | 3/2006 |
| JP | 2003-44789 A | 2/2003 | | JP | 2006-72706 A | 3/2006 |
| JP | 2003-046318 A | 2/2003 | | JP | 2006-80367 A | 3/2006 |
| JP | 2003-58840 A | 2/2003 | | JP | 2006-92630 A | 4/2006 |
| JP | 2003-067711 A | 3/2003 | | JP | 2006-102953 A | 4/2006 |
| JP | 2003-069335 A | 3/2003 | | JP | 2006-107296 A | 4/2006 |
| JP | 2003-076947 A | 3/2003 | | JP | 2006-148518 A | 6/2006 |
| JP | 2003-078336 A | 3/2003 | | JP | 2006-151402 A | 6/2006 |
| JP | 2003-085501 A | 3/2003 | | JP | 2006-174151 A | 6/2006 |
| JP | 2003-085520 A | 3/2003 | | JP | 2006-195795 A | 7/2006 |
| JP | 2003-87008 A | 3/2003 | | JP | 2006-203187 A | 8/2006 |
| JP | 2003-87044 A | 3/2003 | | JP | 2006-203852 A | 8/2006 |
| JP | 2003-099720 A | 4/2003 | | JP | 2006-217000 A | 8/2006 |
| JP | 2003-099721 A | 4/2003 | | JP | 2006-232292 A | 9/2006 |
| JP | 2003-110344 A | 4/2003 | | JP | 2006-270212 A | 10/2006 |
| JP | 2003-132330 A | 5/2003 | | JP | 2006-285911 A | 10/2006 |
| JP | 2003-134007 A | 5/2003 | | JP | 2006-302219 A | 11/2006 |
| JP | 2003-155062 A | 5/2003 | | JP | 2006-309401 A | 11/2006 |

| | | | |
|---|---|---|---|
| JP | 2006-323481 A | 11/2006 |
| JP | 2007-007888 A | 1/2007 |
| JP | 2007007888 A * | 1/2007 |
| JP | 2007-043535 A | 2/2007 |
| JP | 2007-048126 A | 2/2007 |
| JP | 2007-65822 A | 3/2007 |
| JP | 2007-096768 A | 4/2007 |
| JP | 2007-122542 A | 5/2007 |
| JP | 2007-150868 A | 6/2007 |
| JP | 2007-159129 A | 6/2007 |
| JP | 4069958 B2 | 4/2008 |
| JP | 11-175678 A | 1/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/125683 A1 | 11/2007 |
| WO | 2007/138857 A1 | 12/2007 |

OTHER PUBLICATIONS

English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,669, filed Aug. 5, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.

Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.

* cited by examiner

PACKAGING MATERIAL WITH ELECTROMAGNETIC COUPLING MODULE

BACKGROUND OF THE INVENTION

1. Field of the Invention

The present invention relates to packaging materials with electromagnetic coupling modules, and more particularly, to a packaging material with an electromagnetic coupling module having a radio IC chip used in an RFID (Radio Frequency Identification) system.

2. Description of the Related Art

Recently, RFID systems, in which a reader/writer that generates an induction field contactlessly communicates with an IC chip (also referred to as an IC tag and a radio IC chip) that is attached to an article or a container and stores predetermined information to exchange information, have been developed as article management systems. For example, Japanese Unexamined Patent Application Publication No. 2003-26177 discloses a packaging body having an antenna unit and an IC chip that are electrically conductive and provided on an outer surface of a cardboard box. Covering the IC chip with another surface to protect the IC chip is also described.

However, attaching the antenna unit and the IC chip onto the outer surface of the packaging body has a problem of being easily influenced by an external environment, and furthermore, increased thickness areas are provided because the attachment areas project outwardly, whereby accurate stacking such as when stacking and storing the packaging bodies is difficult. When another article contacts the projecting IC chip, the IC chip may be damaged by the shock. The antenna unit and the IC chip must be arranged to overlap each other in an electrically conductive manner. Since the displacement in the overlapping state causes trouble in transmission and reception of signals, high accuracy is required with this arrangement. Furthermore, the radiation characteristic during transmission and reception may not be sufficient since the antenna unit is relatively small.

SUMMARY OF THE INVENTION

To overcome the problems described above, preferred embodiments of the present invention provide a packaging material with an electromagnetic coupling module that is suitable for an RFID system, in which the radio IC chip is protected from external shock and environmental changes without affecting the planarity of the packaging material, the arrangement of the electromagnetic coupling module is facilitated, and the radiation characteristics are satisfactory.

A packaging material with an electromagnetic coupling module according to a preferred embodiment of the present invention includes a packaging material including a sheet-shaped liner, and a wave-shaped core material connected to the liner, and an electromagnetic coupling module including a radio IC chip and a feeder circuit board, on which the radio IC chip is mounted, the feeder circuit board including a resonant circuit that includes an inductance element and that has a predetermined resonant frequency, wherein the electromagnetic coupling module is arranged inside of the packaging material, and the liner or the core material is a dielectric, the feeder circuit board being electromagnetically coupled with the liner or the core material, which is the dielectric, to radiate a transmission signal supplied from the resonant circuit through electromagnetic coupling, and/or to supply the resonant circuit with a received reception signal through electromagnetic coupling.

In the packaging material with an electromagnetic coupling module according to a preferred embodiment of the present invention, the radio IC chip and the feeder circuit board preferably define the electromagnetic coupling module, where an electromagnetic wave is input to the dielectric and the dielectric functions as an electromagnetic radiator by adjusting the characteristic impedance of an input/output portion of the electromagnetic coupling module to characteristic impedance around an interface of the dielectric. Since the electromagnetic coupling module and the dielectric are electromagnetically coupled without being directly electrically coupled, the electromagnetic coupling module also operates even if arranged in the vicinity of the dielectric. Furthermore, since the electromagnetic coupling module does not have to be highly accurately arranged with respect to the dielectric, the arrangement process is significantly simplified.

The radio IC chip is preferably protected from external shock and environmental change without affecting the planarity of the packaging material since the electromagnetic coupling module is arranged inside of the packaging material. The frequency of the transmission signal radiated from the dielectric and the frequency of the reception signal supplied to the radio IC chip are preferably substantially determined by the resonant frequency of the resonant circuit in the feeder circuit board, various shapes of the dielectric can be used and a stable frequency characteristic can be obtained, whereby the radiation characteristic is satisfactory.

Herein, the dielectric indicates a material having a dielectric constant equal to or greater than about 1, and may preferably be paper or resin (polyethylene, polypropylene, polyamide, cellophane, and polyethylene terephthalate), for example.

The radio IC chip may preferably store various kinds of information regarding the contents of the packaging material attached with the electromagnetic module. The information may be rewritable. The radio IC chip may have an information processing function other than that for the RFID system.

According to a preferred embodiment of the present invention, a radio IC chip is protected from external shock and environmental change without affecting the planarity of the packaging material, high accuracy is not required when connecting the radiator and the electromagnetic coupling module and the assembly thereof is facilitated since the electromagnetic coupling module is arranged inside of the packaging material. The electromagnetic coupling module and the dielectric (liner or core material) are preferably electromagnetically coupled, an arbitrary shape of the dielectric (liner or core material) may be used, the radiation characteristic is satisfactory, and a stable frequency characteristic is obtained.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
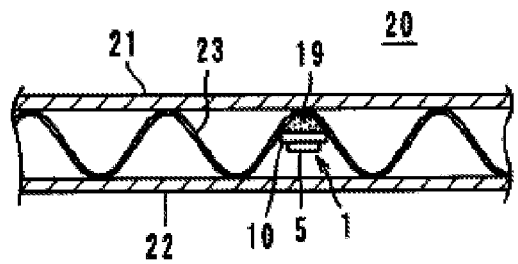
FIG. 1 is a sectional view showing a first preferred embodiment of a packaging material according to the present invention.

Preferred embodiments of a packaging material including an electromagnetic coupling module according to the present invention will be described below with reference to the accompanying drawings. In each figure, the same reference numerals are used to denote common components and portions, and redundant description will not be provided.

First Preferred Embodiment

Figure 2:
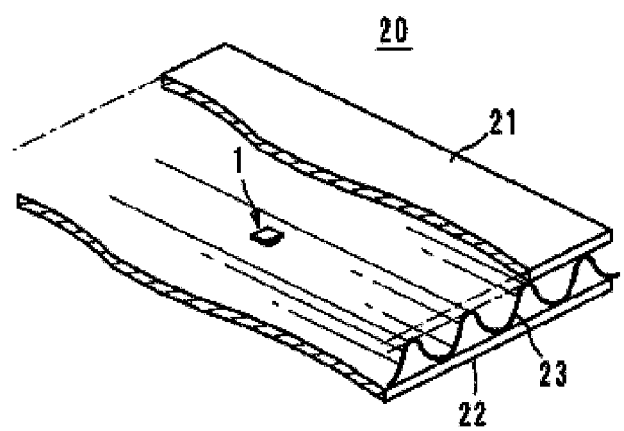
FIG. 2 is a perspective view of the packaging material according to the first preferred embodiment of the present invention shown in FIG. 1.

FIGS. 1 and 2 show a first preferred embodiment of a packaging material including an electromagnetic coupling module according to the present invention, where a packaging material 20 is a cardboard box preferably made of paper, for example, and includes front and back liners 21 and 22, and a core material 23, which preferably has a wave shape (e.g., corrugated) cross-section, disposed between the liners 21 and 22. The packaging material 20 may preferably include the liner 21 on the upper side and the core material 23, as shown in FIGS. 1 and 2.

The electromagnetic coupling module 1 including a radio IC chip 5 and a feeder circuit board 10, on which the radio IC chip 5 is mounted, is preferably adhered to a recessed portion of the core material 23 with an adhesive 19 interposed therebetween. The adhesive 19 preferably has an insulation property, and is preferably made of a material having a high dielectric constant.

The liners 21 and 22 and the core material 23 defining the packaging material 20 are all preferably made of paper and are dielectrics, in which the electromagnetic coupling module 1 electromagnetically couples with the adhesive 19, the core material 23, and the liner 21, which are dielectrics, radiates a transmission signal supplied from a resonant circuit 16, to be described below, through electromagnetic coupling, and supplies the resonant circuit 16 with a received reception signal through electromagnetic coupling. In this case, the liner 21 primarily functions as the radiator of the electromagnetic wave.

Electromagnetic Coupling Module

Figure 3:
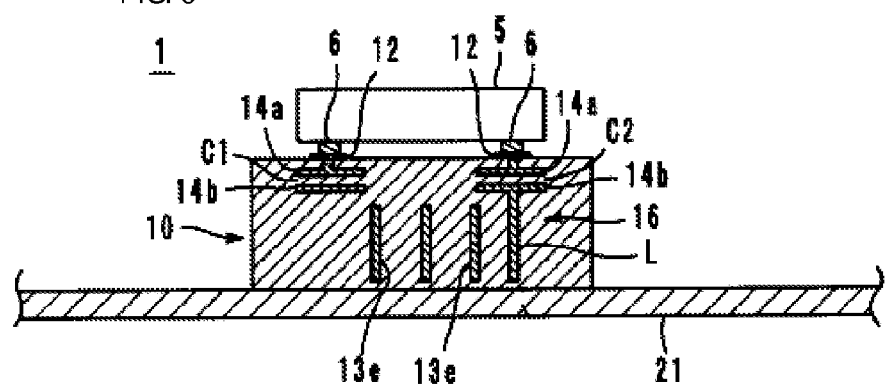
FIG. 3 is a sectional view showing an electromagnetic coupling module.

As shown in FIG. 3, the electromagnetic coupling module 1 includes the radio IC chip 5, and the feeder circuit board 10 on which the radio IC chip 5 is mounted. The radio IC chip 5 preferably includes a clock circuit, a logic circuit, a memory circuit, and other suitable components, stores necessary information, and is electrically connected to a resonant circuit 16 included in the feeder circuit board 10 with metal bumps 6 interposed therebetween. Au, solder, and other suitable materials can preferably be used for the material of the metal bump 6.

Figure 4:
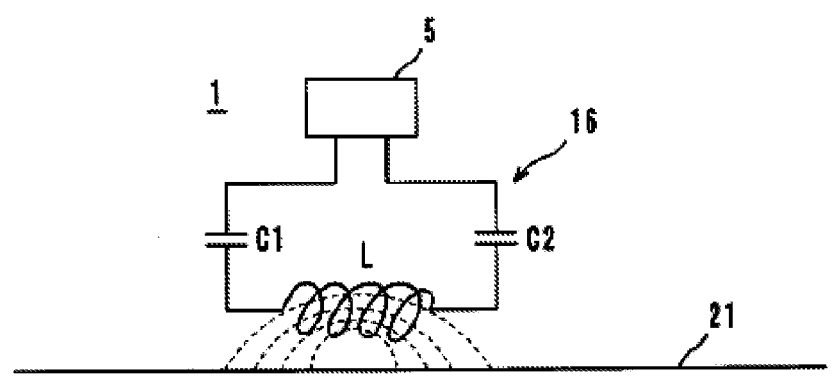
FIG. 4 is an equivalent circuit diagram of the electromagnetic coupling module.

The resonant circuit 16 is preferably arranged to supply the dielectric (liner 21) with a transmission signal having a predetermined frequency, and/or arranged to select a reception signal having a predetermined frequency from signals received by the dielectric (liner 21) and to supply the dielectric (liner 21) with the selected signal, the resonant circuit 16 resonating at a predetermined frequency. As shown in FIG. 3 and FIG. 4, the resonant circuit 16 preferably includes a lumped-constant LC series resonant circuit including a helical inductance element L and capacitance elements C1 and C2.

Figure 5:
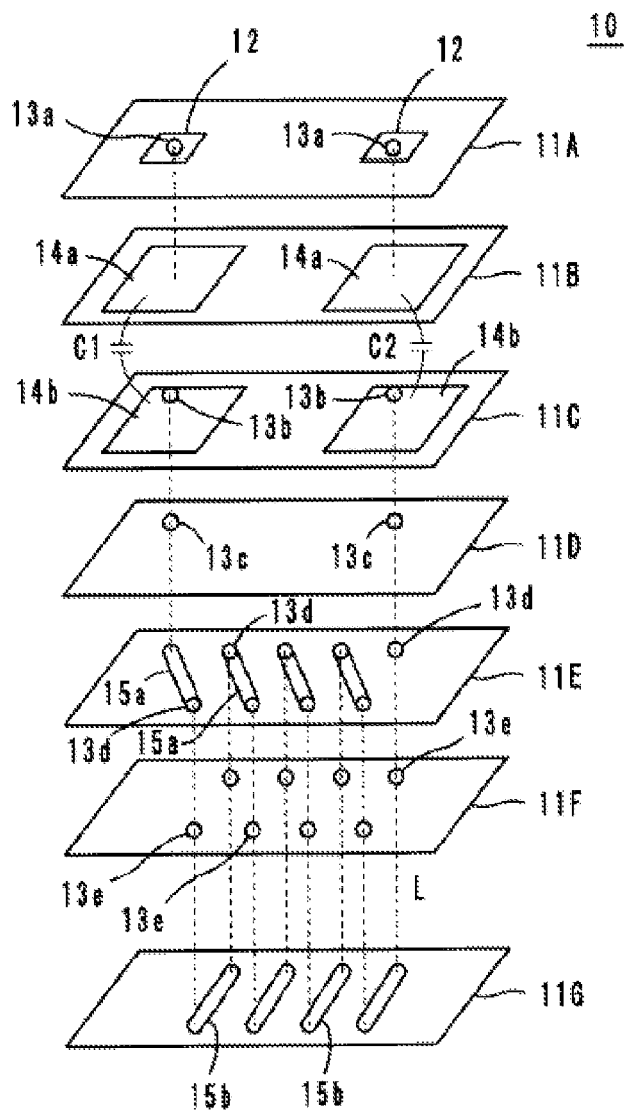
FIG. 5 is an exploded perspective view showing a feeder circuit board.

Specifically, as shown in FIG. 5, the feeder circuit board 10 is preferably formed by stacking, pressure bonding, and firing ceramic sheets 11A to 11G including a dielectric, and includes a sheet 11A including a connection electrode 12 and a via hole conductor 13a, a sheet 11B including a capacitor electrode 14a, a sheet 11C including a capacitor electrode 14b and a via hole conductor 13b, a sheet 11D including a via hole conductor 13c, a sheet 11E including a conductor pattern 15a and a via hole conductor 13d, a sheet 11f (one or more) including a via hole conductor 13e, and a sheet 11G including a conductor pattern 15b. Each ceramic sheet 11A to 11G may preferably be a sheet made of ceramic material of a magnetic body, for example, and the feeder circuit board 10 can preferably be easily obtained through a multi-layer substrate fabricating step, such as a sheet stacking method, a thick film printing method, for example.

When the sheets 11A to 11G are stacked, the inductance element L in which a helical winding axis is parallel or substantially parallel to the dielectric (liner 21), and the capacitance elements C1 and C2 in which the capacitor electrode 14b is connected to both ends of the inductance element L and the capacitor electrode 14a is connected to the connection electrode 12 through the via conductor 13a are provided. The connection electrode 12, which is a substrate side electrode pattern, is preferably electrically connected with a terminal (see FIGS. 6A and 6B) of the radio IC chip 5 with the metal bump 6 interposed therebetween.

In other words, of the elements defining the resonant circuit, the transmission signal is supplied from the inductance element L, which is preferably a coil-shaped electrode pattern, for example, to the dielectric (liner 21) through the magnetic field, and the reception signal is preferably supplied from the dielectric (liner 21) to the inductance element L through the magnetic field. Thus, in the feeder circuit board 10, the inductance element L is preferably arranged so as to be close to the dielectric (liner 21) of the inductance element L and the capacitance elements C1 and C2 defining the resonant circuit 16.

Figure 6A:
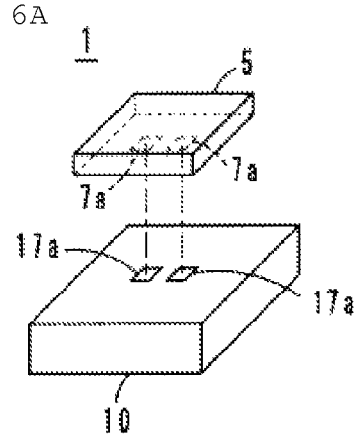
FIGS. 6A and 6B are perspective views showing a connection state of a radio IC chip and the feeder circuit board.
Figure 6B:
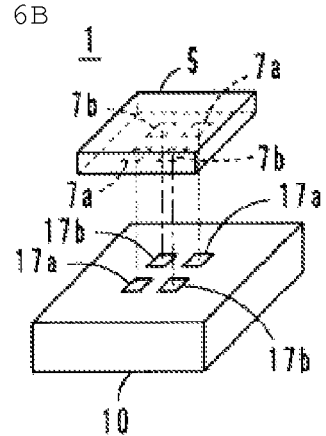

FIG. 6A shows a connection mode of the radio IC chip 5 and the feeder circuit board 10. In FIG. 6A, a pair of antenna (balance) terminals 7a and 17a is provided on the back surface of the radio IC chip 5 and the front surface of the feeder circuit board 10, respectively. FIG. 6B shows another connection mode, in which ground terminals 7b and 17b are respectively provided on the back surface of the radio IC chip 5 and the front surface of the feeder circuit board 10, in addition to the pair of antenna (balance) terminals 7a and 17a. The ground terminal 17b of the feeder circuit board 10 is terminated, and is not connected to other elements of the feeder circuit board 10.

FIG. 4 shows an equivalent circuit of the electromagnetic coupling module 1. The electromagnetic coupling module 1 receives the high frequency signal (e.g., UHF frequency band) radiated from the reader/writer (not shown) with the dielectric (liner 21), resonates the resonant circuit 16 (LC series resonant circuit including inductance element L and capacitance elements C1 and C2) that is primarily magnetically coupled with the dielectric (liner 21), and supplies the radio IC chip 5 with only the reception signal of a predetermined frequency band. The predetermined energy is output from such a reception signal, and the information stored in the radio IC chip 5 is preferably adjusted to match a predetermined frequency in the resonant circuit 16 with the energy as a driving source, and thereafter, the transmission signal is transmitted from the inductance element L to the dielectric (liner 21) through magnetic coupling and then transmitted and transferred from the dielectric (liner 21) to the reader/writer.

The coupling of the resonant circuit 16 and the dielectric is preferably primarily a coupling through a magnetic field, but may be also include coupling through an electric field. In preferred embodiments of the present invention, "electromagnetic coupling" refers to the coupling through an electric field and/or a magnetic field.

In the resonant circuit 16, the resonant frequency characteristic is determined by the resonant circuit defined by the inductance element L and the capacitance elements C1 and C2. The resonant frequency of the signal radiated from the dielectric is substantially determined by the self-resonant frequency of the resonant circuit 16. Therefore, the dielectric having any suitable shape can be used, and the relative position of the electromagnetic coupling module 1 with respect to the dielectric is arbitrary. Therefore, the attachment position of the electromagnetic coupling module 1 does not need to be controlled with high accuracy.

Furthermore, the coil-shaped electrode pattern defining the inductance element L is preferably configured such that the winding axis is parallel or substantially parallel to the dielectric, and thus, has an advantage in that the center frequency does not substantially fluctuate. Since the capacitance elements C1 and C2 are preferably arranged at the post-stage of the radio IC chip 5, the surge of low frequency can be cut with the elements C1 and C2, and the radio IC chip 5 can be effectively protected from the surge.

The resonant circuit 16 also preferably functions as a matching circuit arranged to match the impedance of the radio IC chip 5 and the impedance of the dielectric. The feeder circuit board 10 may preferably include a matching circuit, defined by the inductance element and the capacitance element, provided separately from the resonant circuit 16. If the function of the matching circuit is also provided by the resonant circuit 16, the design of the resonant circuit 16 tends to become complicated. If the matching circuit is provided separately from the resonant circuit 16, the resonant circuit and the matching circuit can be independently designed.

According to the first preferred embodiment of the present invention, since the electromagnetic coupling module 1 is arranged inside of the packaging material 20, the radio IC chip 5 can be protected from external shock and environmental changes without affecting the planarity of the packaging material 20. Furthermore, since the frequency of the transmission/reception signal is substantially determined by the resonant frequency of the resonant circuit 16 of the feeder circuit board 10, high accuracy is not required when connecting the dielectric and the electromagnetic coupling module 1 and the assembly thereof is facilitated. Moreover, the electromagnetic coupling module 1 and the dielectric are electromagnetically coupled, any suitable arbitrary shape of the dielectric may be used, the radiation characteristics are satisfactory, and a stable frequency characteristic is obtained.

Second Preferred Embodiment

Figure 7A:
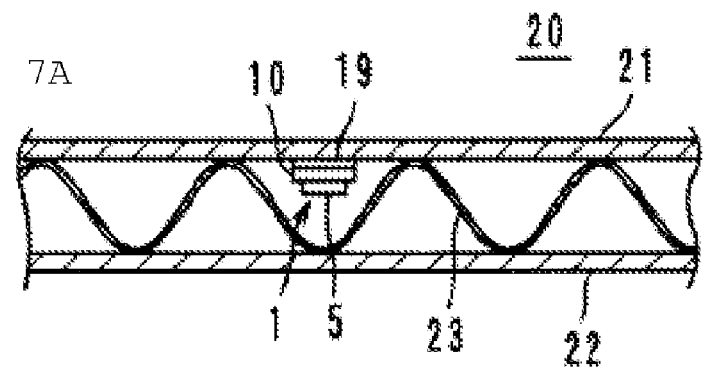
FIG. 7A is a sectional view showing a second preferred embodiment of a packaging material according to the present invention, and 7B is a sectional view showing a modified example thereof.
Figure 7B:
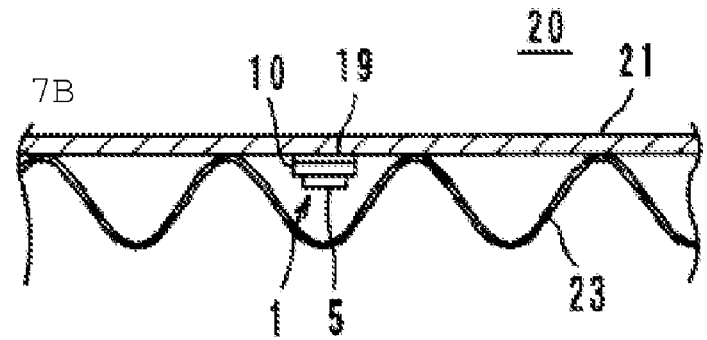

As shown in FIG. 7A, the second preferred embodiment of the present invention describes the arrangement of the feeder circuit board 10 of the electromagnetic module 1 on an inner surface side of the liner 21 with the adhesive 19. The liner 21 is a dielectric and functions as a radiator, as described in the first preferred embodiment. The effects and advantages of the second preferred embodiment are similar to the first preferred embodiment. The packaging material 20 may preferably include the liner 21 on the upper side and the core material 23, as shown in FIG. 7B.

Third Preferred Embodiment

Figure 8:
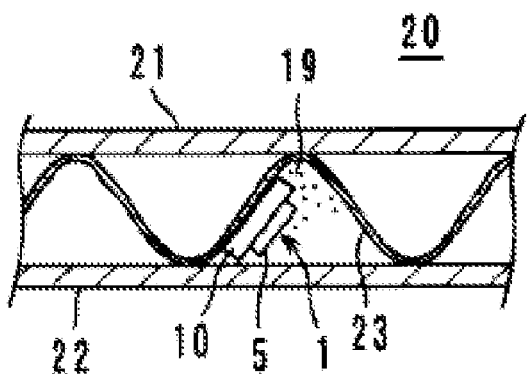
FIG. 8 is a sectional view showing a third preferred embodiment of a packaging material according to the present invention.

As shown in FIG. 8, the third preferred embodiment of the present invention describes the arrangement of the feeder circuit board 10 of the electromagnetic coupling module 1 on an inclined portion of the core material 23 with the adhesive 19. The core material 23 is a dielectric and functions as a radiator. The effects and advantages of the third preferred embodiment are similar to the first preferred embodiment.

Fourth Preferred Embodiment

Figure 9:
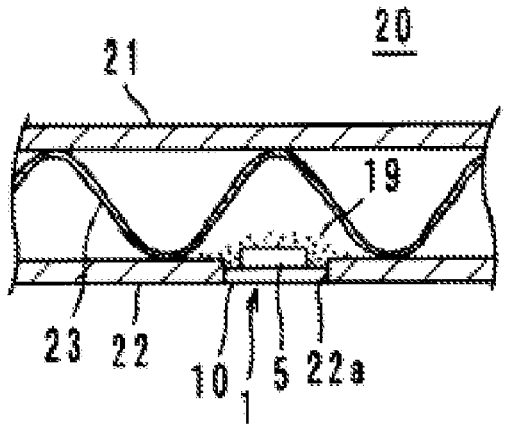
FIG. 9 is a sectional view showing a fourth preferred embodiment of a packaging material according to the present invention.

As shown in FIG. 9, the fourth preferred embodiment of the present invention describes an arrangement in which a hole 22a is provided in the liner 22 and the electromagnetic module 1 is fixed in the hole 22a with the adhesive 19. In this case, the liner 22, which is a dielectric, functions as the radiator of the electromagnetic coupling module 1. The effects and advantages of the fourth preferred embodiment are similar to the first preferred embodiment.

The packaging material including the electromagnetic coupling module according to the present invention is not limited to the above-described preferred embodiments, and can be variously changed within the scope of the invention.

In particular, a paper cardboard box is described for the packaging material including the electromagnetic coupling module and the radiator in each of the preferred embodiments described above. However, the packaging material may preferably be made of resin, for example. The details of the internal configuration of the feeder circuit board and the detailed shape of the radiator can be arbitrarily selected, and the feeder circuit board may preferably be made of a flexible material, for example. Furthermore, processes other than metal bump bonding may preferably be used to connect the radio IC chip to the feeder circuit board.

As described above, preferred embodiments of the present invention are useful for the packaging material including the electromagnetic coupling module, and are particularly advantageous in that the radio IC chip is protected from external shock and environmental changes without affecting the planarity of the packaging material, the arrangement of the electromagnetic coupling module is easy, and the radiation characteristic is satisfactory.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A packaging material with an electromagnetic coupling module comprising:
   a packaging material including a liner, and a core material connected to the liner; and
   an electromagnetic coupling module including a radio IC chip and a feeder circuit board on which the radio IC chip is mounted, the feeder circuit board including a resonant circuit that includes an inductance element and has a predetermined resonant frequency; wherein the electromagnetic coupling module is arranged inside of the packaging material; and at least one of the liner or the core material is a dielectric, the feeder circuit board being electromagnetically coupled with the at least one of the liner or the core material which is the dielectric, and arranged to radiate a transmission signal supplied from the resonant circuit through electromagnetic coupling and/or to supply the resonant circuit with a received reception signal through the electromagnetic coupling.

2. The packaging material with the electromagnetic coupling module according to claim 1, wherein the electromagnetic coupling module is arranged on the core material.

3. The packaging material with the electromagnetic coupling module according to claim 1, wherein the electromagnetic coupling module is arranged on the liner.

4. The packaging material with the electromagnetic coupling module according to claim 1, wherein at least one of the liner and the core material is made of paper.

5. The packaging material with the electromagnetic coupling module according to claim 1, wherein the liner is sheet-shaped.

6. The packaging material with the electromagnetic coupling module according to claim 1, wherein the core material is wave-shaped.

7. The packaging material with the electromagnetic coupling module according to claim 1, wherein the packaging material further includes another liner, and the core material is disposed between the liner and the another liner.

* * * * *